(12) United States Patent
Hashimoto

(10) Patent No.: US 9,481,114 B2
(45) Date of Patent: Nov. 1, 2016

(54) IMPRINT METHOD

(71) Applicant: CANON KABUSHIKI KAISHA, Tokyo (JP)

(72) Inventor: Tsutomu Hashimoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/620,793

(22) Filed: Feb. 12, 2015

(65) Prior Publication Data
US 2015/0151462 A1    Jun. 4, 2015

Related U.S. Application Data

(62) Division of application No. 13/086,586, filed on Apr. 14, 2011, now abandoned.

(51) Int. Cl.
| | |
|---|---|
| *B29C 39/44* | (2006.01) |
| *G03F 7/00* | (2006.01) |
| *B82Y 10/00* | (2011.01) |
| *B82Y 40/00* | (2011.01) |
| *B29C 39/00* | (2006.01) |
| *B29C 59/02* | (2006.01) |

(52) U.S. Cl.
CPC ............. *B29C 39/44* (2013.01); *B29C 39/003* (2013.01); *B29C 59/026* (2013.01); *B82Y 10/00* (2013.01); *B82Y 40/00* (2013.01); *G03F 7/0002* (2013.01); *B29K 2995/0035* (2013.01)

(58) Field of Classification Search
CPC ... B29C 39/44; B29C 39/003; B29C 59/026; B29K 2995/0035
See application file for complete search history.

(56) References Cited

U.S. PATENT DOCUMENTS 5,849,209 A    12/1998   Kindt-Larsen et al.
6,337,672 B1 *  1/2002   Inoguchi et al. ............. 345/1.1
(Continued)

FOREIGN PATENT DOCUMENTS

| | | |
|---|---|---|
| JP | 53-45180 A | 4/1978 |
| JP | 61-182238 A | 8/1986 |

(Continued)

OTHER PUBLICATIONS

TW Office Action issued May 20, 2013 for TW 100113551.
(Continued)

*Primary Examiner* — Jeremiah Smith
(74) *Attorney, Agent, or Firm* — Rossi, Kimms & McDowell LLP

(57) ABSTRACT

An imprint method using a mold includes the steps of applying on a substrate a resin composed of a mixture of an ultraviolet curable resin cured with ultraviolet light and a luminescent material that undergoes fluorescence or phosphorescence upon receiving ultraviolet light, imprinting the mold into the resin applied to the substrate, curing the resin applied to the substrate using ultraviolet light, releasing the mold from the substrate imprinted with the pattern, and detecting light from any residual resin remaining on the mold. The imprint method can use an imprint apparatus that includes a light-emission detecting unit configured to detect light emitted from the luminescent material. After the mold is released from the resin on the substrate, the detecting step can use the light-emission detecting unit to detect light emitted from any residual resin remaining in a concave and convex portion of the pattern formed on the mold.

5 Claims, 4 Drawing Sheets

(56) References Cited

U.S. PATENT DOCUMENTS

| | | |
|---|---|---|
| 7,070,405 B2 | 7/2006 | Sreenivasan et al. |
| 7,547,398 B2 | 6/2009 | Schmid et al. |
| 2004/0183236 A1* | 9/2004 | Ogino et al. .................. 264/496 |
| 2005/0116370 A1 | 6/2005 | Ogino et al. |
| 2005/0187339 A1 | 8/2005 | Xu et al. |
| 2006/0231779 A1 | 10/2006 | Isobe |
| 2007/0283883 A1* | 12/2007 | Dakshina-Murthy et al. . 118/75 |
| 2008/0191372 A1 | 8/2008 | Takaoka |
| 2008/0225270 A1 | 9/2008 | Senga et al. |
| 2009/0214761 A1 | 8/2009 | Sreenivasan et al. |
| 2010/0314798 A1 | 12/2010 | Kawakami |
| 2011/0049097 A1 | 3/2011 | Wuister et al. |
| 2011/0064925 A1* | 3/2011 | Van Bommel ......... B82Y 10/00 428/195.1 |
| 2013/0106023 A1 | 5/2013 | Limura et al. |

FOREIGN PATENT DOCUMENTS

| | | | |
|---|---|---|---|
| JP | 6-215995 A | 8/1994 | |
| JP | 2005-153091 A | 6/2005 | |
| JP | 2007-081048 * | 3/2007 | ........... H01L 21/027 |
| JP | 2007-081048 A | 3/2007 | |
| JP | 2007-296823 A | 11/2007 | |
| JP | 2008-194838 A | 8/2008 | |
| JP | 2011091104 A | 5/2011 | |
| KR | 20080084592 A | 9/2008 | |
| TW | 200423828 A | 11/2004 | |
| TW | 201100239 A | 1/2011 | |
| TW | I338615 B | 3/2011 | |

OTHER PUBLICATIONS

KIPO Notice of Preliminary Rejection for KR 10-2011-0036127, mail date Aug. 8, 2013. English translation provided.

Notice of Reasons for Rejection for JP 2009-241679, mail date Aug. 27, 2013. English translation provided.

Non-Final Office Action issued in U.S. Appl. No. 13/086,586, dated Apr. 1, 2013.

Final Office Action issued in U.S. Appl. No. 13/086,586, dated Nov. 8, 2013.

Non-Final Office Action issued in U.S. Appl. No. 13/086,586, dated May 22, 2014.

* cited by examiner

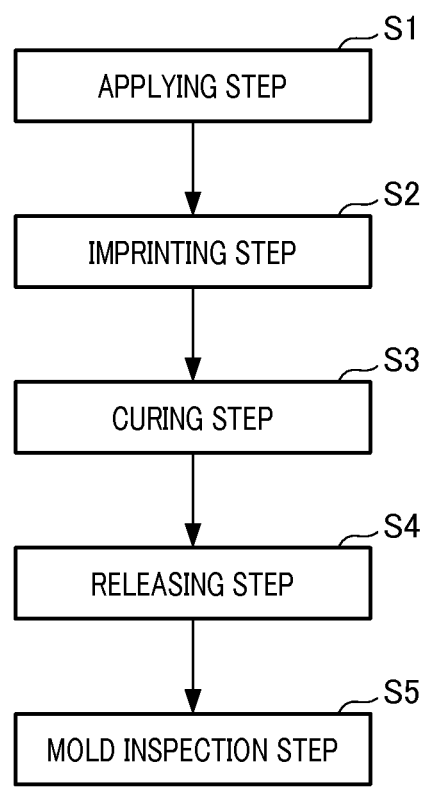

IMPRINT METHOD

BACKGROUND OF THE INVENTION

1. Field of the Invention

The present invention relates to an imprint method.

2. Description of the Related Art

Photo imprint technology is a technology in which a mold on which a fine concave and convex pattern is formed by using electron beam exposure or the like is imprinted against a substrate on which an ultraviolet curable resin is applied to thereby transfer the concave and convex pattern onto the ultraviolet curable resin. For example, in an imprint apparatus that employs a photo-curing type imprint technology and forms the concave and convex pattern of the mold onto a wafer, that is, a treatment object substrate, an image is usually formed on an ultraviolet curable resin which is then subjected to etching processing, whereby fine processing is performed on the wafer. However, when the mold is then released from the wafer, ultraviolet curable resin may remain on the concave and convex portion of the mold. In this case, the concave and convex pattern of the mold cannot be accurately transferred onto the wafer at the portions where the ultraviolet curable resin remains during a next imprint operation. Consequently, a device manufactured through that process may become defective.

Accordingly, in recent years, various mold inspection apparatuses that detect an ultraviolet curable resin remaining on the concave and convex portion of a mold have been proposed. Japanese Patent Laid-Open No. 2008-194838 discloses a mold inspection method that detects a residual resin adhering to a mold using an atomic force microscope (AFM). Japanese Patent Laid-Open No. 2007-296823 discloses a mold-release processing method in which a labeling substance is adhered to a mold release agent as a method for confirming whether or not the surface of a mold is coated with a mold release agent in sufficient quantity to impart a mold-release capability in a quick and simple manner. Furthermore, Japanese Patent Laid-Open No. 2007-081048 discloses an imprint apparatus that detects light, which is produced by a stress change upon mold-releasing, by incorporating a stress luminescent material in a resin, and detects a mold-release start point and a mold-release start timing to thereby control a mold-release operation.

However, in the mold inspection method disclosed in Japanese Patent Laid-Open No. 2008-194838, since a probe for the atomic force microscope is so small (the diameter of the probe is equal to or less than approximately 20 nm), the inspection of the entire surface of the mold is time consuming. Also, in the mold-release processing method disclosed in Japanese Patent Laid-Open No. 2007-296823, a mold release agent on the surface of the mold can be detected, whereas it is difficult to detect an ultraviolet curable resin remaining on the mold. Furthermore, in the imprint apparatus disclosed in Japanese Patent Laid-Open No. 2007-081048, the stress of a resin can be detected from a stress luminescent material contained in the resin, whereas it is difficult to detect an ultraviolet curable resin remaining on the mold.

SUMMARY OF THE INVENTION

The present invention has been developed in consideration of the circumstances described above, and provides an imprint method capable of inspecting an ultraviolet curable resin, which remains on the concave and convex portion formed on the pattern surface of a mold, in a short period of time.

According to an aspect of the present invention, an imprint method of forming a pattern of a cured resin on a substrate using a mold is provided. The method comprises a step of applying a resin on the substrate, the resin being composed of a mixture of an ultraviolet curable resin that is cured by receiving ultraviolet light and a luminescent material that undergoes fluorescence or phosphorescence upon receiving ultraviolet light, a step of imprinting the mold into the resin applied to the substrate, a step of curing the resin applied to the substrate using ultraviolet light, a step of releasing the mold from the substrate that has been imprinted with the pattern, and a step of detecting light from any residual resin remaining on the mold. The method can use an imprint apparatus having the mold that molds and cures a resin on a substrate to form a pattern of the cured resin on the substrate. The imprint apparatus includes a light-emission detecting unit configured to detect light emitted from the luminescent material. After the mold is released from the resin, the detecting step can use the light-emission detecting unit to detect light emitted from any residual resin remaining in the concave and convex portion of the pattern formed on the mold.

According to the present invention, since a luminescent material is mixed with an ultraviolet curable resin and light emitted from the luminescent material is detected by a light-emission detecting unit, the inspection of a mold to determine whether or not a residual resin is present on the concave and convex portion of the mold can be performed in a short period of time.

Further features of the present invention will become apparent from the following description of exemplary embodiments with reference to the attached drawings.

BRIEF DESCRIPTION OF THE DRAWINGS

FIG. 5 is a flowchart illustrating a flow of an imprint processing according to this invention.

DESCRIPTION OF THE EMBODIMENTS

Hereinafter, preferred embodiments of the present invention will now be described with reference to the accompanying drawings.

First Embodiment

Figure 1:
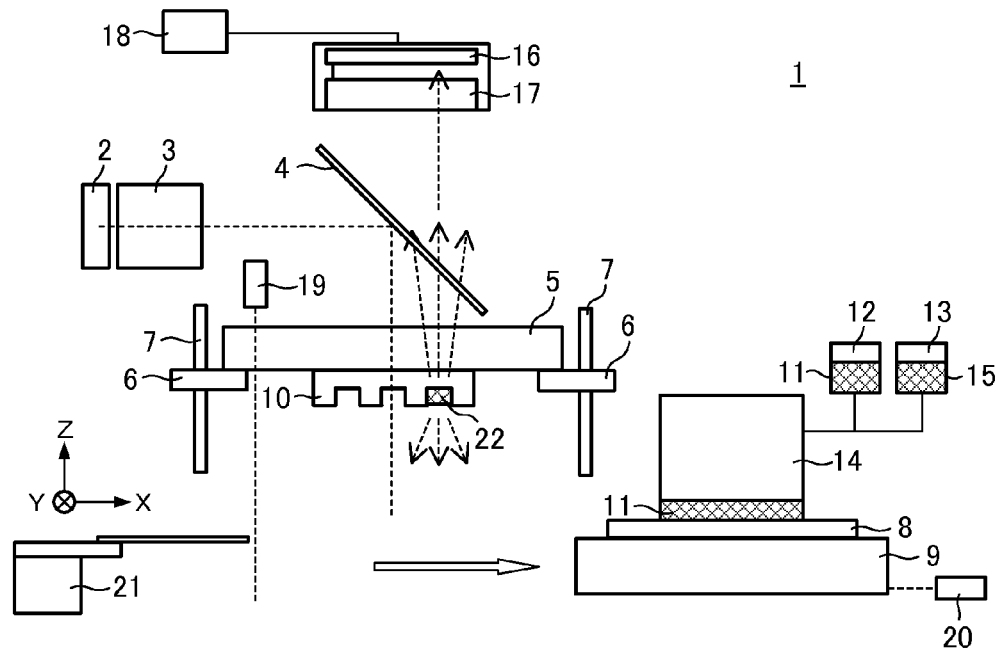
FIG. 1 is a schematic diagram illustrating the configuration of an imprint apparatus according to a first embodiment of the present invention.

First, the configuration of the imprint apparatus of the present invention will be described. FIG. 1 is a schematic diagram illustrating the configuration of an imprint apparatus according to a first embodiment of the present invention.

The imprint apparatus according to the present embodiment is a processing apparatus that transfers the concave and convex pattern of a mold onto a wafer (onto a substrate), i.e., a treatment object substrate, which is used for a semiconductor device manufacturing process, and is an apparatus that employs a photo-curing method among the imprint technologies. Since mold inspection according to the present embodiment is performed after imprint processing, FIG. 1 shows the state of the imprint apparatus after imprint processing. In the following drawings, a description will be given in which the Z axis is oriented parallel to the irradiation axis of ultraviolet light for a mold, the X axis is oriented in the direction in which a wafer stage moves with respect to a dispenser 14 to be described below in a plane perpendicular to the Z axis, and the Y axis is oriented in the direction perpendicular to the X axis. An imprint apparatus 1 includes a light source 2, an illumination unit 3, a half mirror 4, a mold stage 6, a mold stage driving section 7, and a wafer stage 9.

The light source 2 and the illumination unit 3 are an illumination optical system that irradiates a mold 5 with ultraviolet light during imprint processing. The illumination unit 3 is constituted by a plurality of optical elements that adjust ultraviolet light emitted from the light source 2 to a light suitable for imprint. Here, in the imprint apparatus 1 of the present embodiment, an imaging element 16 disposed above the ultraviolet light irradiation face of the mold 5, which will be described below. Therefore, the light source 2 and the illumination unit 3 are disposed on the upper side of the ultraviolet light irradiation face of the mold 5, and refracts ultraviolet light, which has been irradiated in a horizontal direction (X-axial direction), at a 90 degree angle using the half mirror 4 disposed between the mold 5 and the imaging element 16 to thereby irradiate the mold 5 with ultraviolet light.

The mold 5 is a mold material in which a predetermined concave and convex pattern (e.g., circuit pattern) 10 is three-dimensionally formed on the opposite surface of a wafer 8. The surface of the concave and convex pattern 10 is processed to a high flatness so as to maintain the adhesion between the surfaces of the concave and convex pattern 10 and the wafer 8. Note that the material of the mold 5 is a material such as quartz or the like through which ultraviolet light can pass.

The mold stage 6 is a stage device that holds a side portion of the mold 5 and fixes the mold 5. Also, the mold stage driving section 7 has an actuator (not shown), and is a driving device that drives the mold stage 6 in the Z-axial direction so as to press the mold 5 against an ultraviolet curable resin formed on the wafer 8. An actuator employed for the mold stage driving section 7 is not particularly limited provided that it can drive at least in the Z-axial direction. A linear motor, an air cylinder, and the like can be employed. Alternatively, in order to perform a mold-release operation with high precision so as to prevent the cured ultraviolet curable resin from being damaged when a mold-release operation for releasing the mold 5 from the ultraviolet curable resin is performed, an actuator may be employed to carry out a coarse operation and a micro operation in a divided manner.

The wafer 8 is a treatment object substrate consisting of, for example, a single crystal silicon, and an ultraviolet curable resin 11 is applied on the treatment surface. As units configured to apply the ultraviolet curable resin 11 on the treatment surface, the imprint apparatus 1 includes a resin container 12, a luminescent material container 13, and a dispenser 14. The resin container 12 is a container that stores the ultraviolet curable resin 11. Also, the luminescent material container 13 is a container that stores a luminescent material 15 to be mixed with the ultraviolet curable resin 11. The luminescent material 15 is a feature of the present invention. The luminescent material 15 is a material that serves as an index when a resin remaining on the mold 5 is inspected, and has properties that cause it to fluoresce or phosphoresce by receiving ultraviolet light. Platinum barium cyanide, zinc sulfide, cadmium sulfide, radium compound, promethium compound, and the like, for example, can be employed as the luminescent material 15. Note that the ultraviolet curable resin 11 to be used may be changed appropriately depending on the type of circuit pattern for the device to be manufactured. In order to respond to such cases, a plurality of containers 12 and 13 may be provided so as to store a plurality of types of the ultraviolet curable resins 11 and the luminescent materials 15, respectively, such that the luminescent material 15 to be mixed may be changed appropriately depending on the type of the ultraviolet curable resin 11. Furthermore, the dispenser 14 is an application device that mixes the ultraviolet curable resin 11 and the luminescent material 15, and applies the resulting mixture on the wafer 8. While in the present embodiment, the dispenser 14 is a mixing unit configured to mix the ultraviolet curable resin 11 with the luminescent material 15, a device (mixing unit) separate from the dispenser 14 may perform mixing processing. Further, a mixing unit need not be provided in the apparatus, and the ultraviolet curable resin 11 and the luminescent material 15, which have already been mixed outside the apparatus, may be supplied to the dispenser 14.

The wafer stage 9 is a substrate stage that holds the wafer 8 by vacuum suction and is freely moveable in the XY plane. As an actuator for driving the wafer stage 9, a linear motor can be employed, but this is not particularly limited.

The imprint apparatus 1 further includes an imaging element 16 that is disposed above the irradiation axis (the Z axis) of ultraviolet light to be irradiated onto the mold 5. The imaging element 16 is a light-emission detecting unit configured to detect an ultraviolet curable resin (a residual resin 22) remaining on the mold 5. In the present embodiment, a CCD camera is employed but a CMOS camera or the like may also be employed. In order to detect small quantities of the residual resin 22, a magnifying lens 17 may be provided with the imaging element 16 as shown in FIG. 1. Furthermore, the imprint apparatus 1 includes a control unit 18 configured to control a processing operation for the mold 5 depending on the inspection result of the mold 5 based on the image acquired by the imaging element 16. A processing operation for the mold 5 includes, for example, at least one of displaying of the result of inspection, exchange of the mold 5, or cleaning of the mold 5. The control unit 18 is constituted by a computer, a sequencer, and the like that are connected to the components of the imprint apparatus 1 through a line, and executes an inspection method to be described below by a program or a sequence. Note that the control unit 18 may be integrated with the imprint apparatus 1, or may be installed at a location separate from the location where the imprint apparatus 1 is installed to thereby be controlled remotely.

Also, the imprint apparatus 1 includes an alignment scope 19 that performs aligning of the wafer 8, a laser interferometer 20 that measures the position of the wafer stage 9, and a conveying robot 21 that places the wafer 8 onto the wafer stage 9. Furthermore, the imprint apparatus 1 includes a chamber that keeps the interior of the apparatus clean and at a constant temperature, and a vibration isolation device that isolates vibrations from the outside (neither of which are not illustrated). Since these devices are not directly relevant to the present invention, no further description will be given here.

Next, imprint processing performed by the imprint apparatus 1 of the present embodiment will now be described. FIG. 5 is a flowchart illustrating the flow of an imprint processing by the imprint apparatus 1 of the present embodiment. First, the imprint apparatus 1 places and fixes a first wafer 8 on the wafer stage 9, and then moves the wafer stage 9 to the application position of the dispenser 14. Next, the dispenser 14 applies the ultraviolet curable resin 11 containing the luminescent material 15 to a treatment surface of the wafer 8 (step S1). In this case, the content of the luminescent material 15 is not particularly limited, but may be set appropriately as long as the imaging element 16 can detect fluorescence or phosphorescence emitted from the luminescent material 15. Next, the imprint apparatus 1 moves the wafer stage 9 below the mold 5, and then drives the mold stage driving section 7 to thereby imprint the mold 5 into the ultraviolet curable resin 11 that has been applied on the wafer 8 (step S2). At this time, the ultraviolet curable resin 11 flows along the concave and convex pattern 10 formed on the mold 5 by pressing the mold 5. Under this condition, the light source 2 emits ultraviolet light from the rear side (upper side) of the mold 5, and the ultraviolet curable resin 11 is cured by the ultraviolet light that has been transmitted through the mold 5 (step S3). After the ultraviolet curable resin 11 is cured, the imprint apparatus 1 again drives the mold stage driving section 7 to thereby release the mold 5 from the wafer 8 (step S4). By the aforementioned steps, a three dimensionally shaped ultraviolet curable resin layer 11 following the concave and convex pattern of the mold 5 is formed on the surface of the wafer 8.

Next, the mold inspection processing performed by the imprint apparatus 1 of the present embodiment will now be described. First, the conveying robot 21 carries the first wafer 8 on which the ultraviolet curable resin layer is formed out from the wafer stage 9 to a next step. Here, since the luminescent material 15 is previously contained in the ultraviolet curable resin 11 applied onto the wafer 8, the residual resin 22 emits light when a very small amount of the residual resin 22 remains on the concave and convex portion (the concave and convex pattern 10) of the mold 5. Thus, the imaging element 16 measures light emitted from the residual resin 22 from the rear surface of the mold 5, and transmits the inspection result to the control unit 18. Then, based on the inspection result, the control unit 18 determines whether or not light emitted from the residual resin 22 has been detected. In the present embodiment, a CCD camera is employed as the imaging element 16. Hence, the inspection result for the entire area of the concave and convex pattern 10 of the mold 5 can be output as a map based on two-dimensional coordinate data and image output data. In this manner, the position and the size of the residual resin 22 can be grasped accurately. The position of the CCD camera is brought close to the mold 5, whereby the entire area of the concave and convex pattern 10 can be inspected even when the quantity of light emitted from the residual resin 22 is low. When the CCD camera is brought so close to the mold 5, a field of view may be tightened, but the entire area of the concave and convex pattern 10 can be inspected by driving the CCD camera to an arbitrary position. Note that such mold inspection processing may be performed in parallel with an application operation in which the ultraviolet curable resin 11 is applied onto a second wafer 8, that is, a next treatment object substrate.

Figure 2:
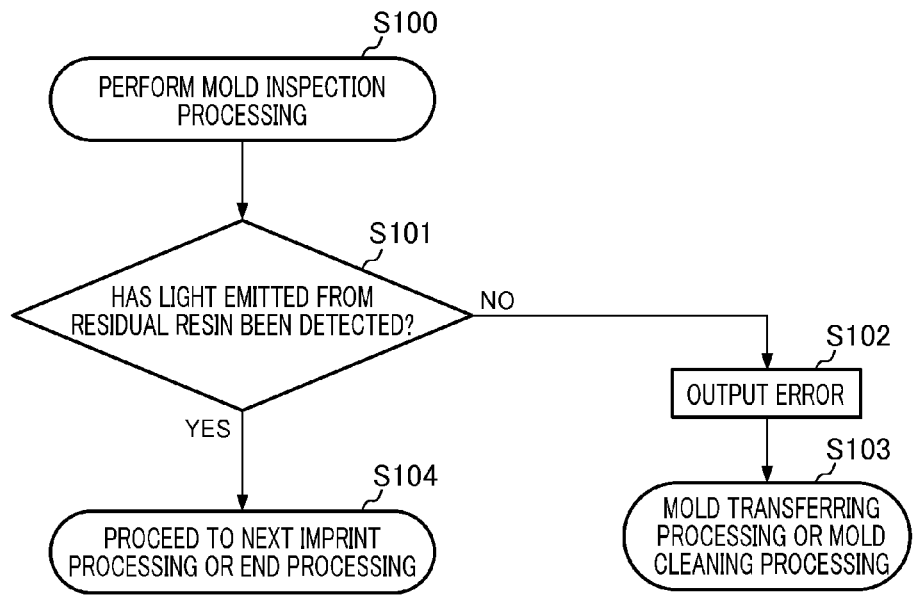
FIG. 2 is a flowchart illustrating an operation of an apparatus after mold inspection processing.

Next, a processing operation performed by the imprint apparatus 1 after mold inspection processing will now be described. FIG. 2 is a flowchart illustrating the operation procedure performed by the imprint apparatus 1 after mold inspection processing. First, the imprint apparatus 1 implements the aforementioned mold inspection processing corresponding to step S5 shown in FIG. 5 (step S100). Next, the control unit 18 determines whether or not light emitted from the residual resin 22 has been detected (step S101). Here, when the control unit 18 detects light emitted from the residual resin 22, the control unit 18 determines that it is impossible to continuously use the mold 5 being currently used, outputs an error, and reports it to an operator of the imprint apparatus 1 (step S102). Then, with the instruction given by the operator or a pre-set transfer program, the imprint apparatus 1 carries the mold 5 being currently used out from the mold stage 6 (step S103). When a cleaning device that performs the cleaning of the mold 5 is disposed on either interior or exterior of the imprint apparatus 1, the mold 5 on which the residual resin 22 remains is transferred to the cleaning device for performing cleaning processing. In this case, the portions to be cleaned become clarified by the inspection result (data of two-dimensional coordinates and the image output of the residual resin 22) acquired by mold inspection processing, whereby mold cleaning can be efficiently performed. On the other hand, in step S101, when the control unit 18 does not detect light emitted from the residual resin 22, the mold 5 being currently used can be used continuously. Thus, the imprint apparatus 1 proceeds to the next imprint processing for the second wafer 8. When a next treatment object substrate is absent, the imprint apparatus 1 simply ends imprint processing (step S104).

As described above, according to the imprint apparatus 1 of the present embodiment, when the residual resin 22 is present on the concave and convex portion of the mold 5, the residual resin 22 can be detected in a short time. Therefore, the downtime of the imprint apparatus 1 can be suppressed to the minimum.

Second Embodiment

Figure 3A:
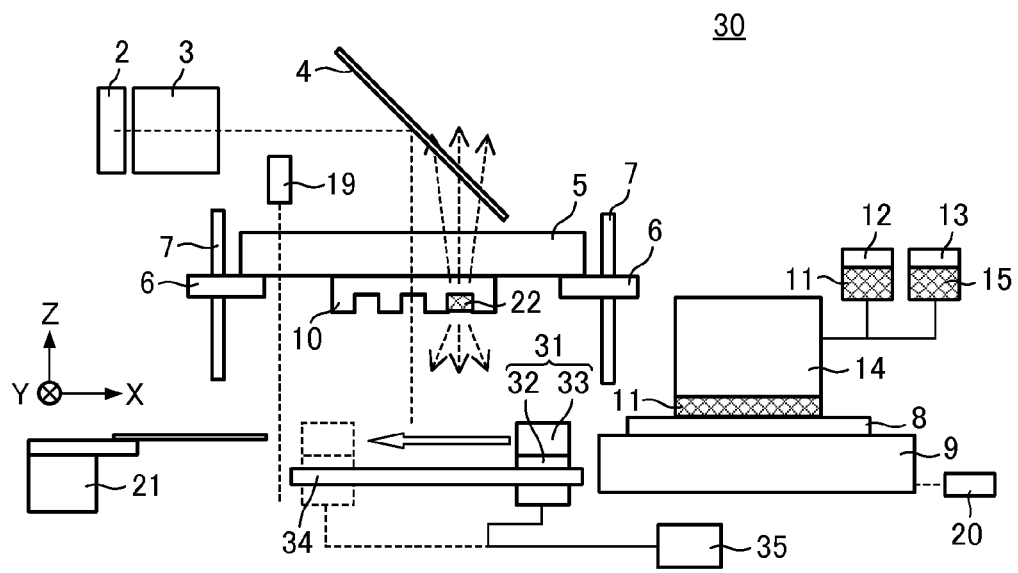
FIG. 3A is a schematic diagram illustrating the configuration of an imprint apparatus according to a second embodiment of the present invention.
Figure 3B:
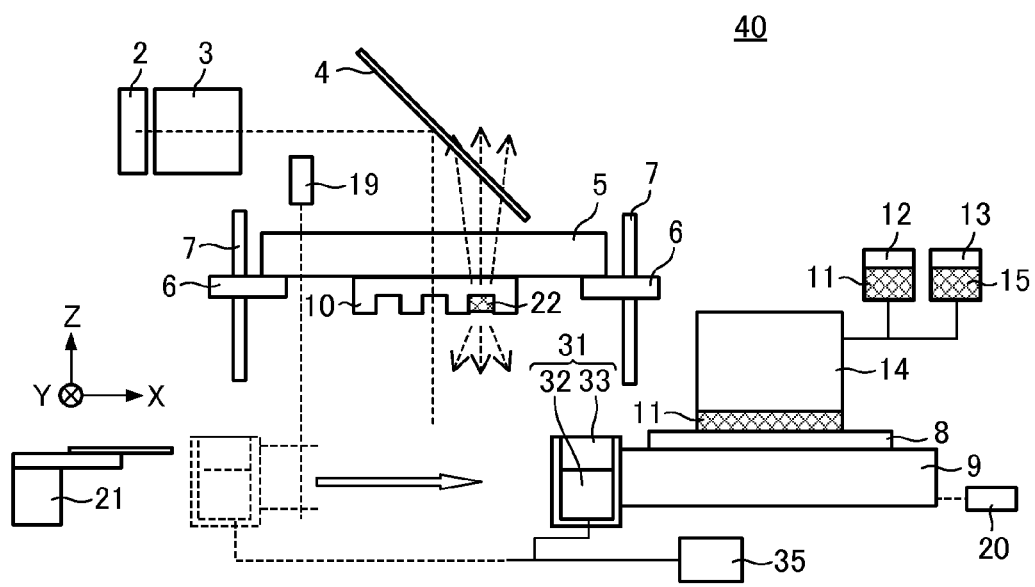
FIG. 3B is a schematic diagram illustrating the configuration of an imprint apparatus according to a second embodiment of the present invention.

Next, an imprint apparatus according to a second embodiment of the present invention will now be described. FIG. 3A is a schematic diagram illustrating the configuration of an imprint apparatus according to a second embodiment of the present invention, and FIG. 3B is a schematic diagram illustrating a variant example thereof. Since a mold inspection of the present embodiment is carried out after imprint processing, each of FIGS. 3A and 3B shows the state of the imprint apparatus after imprint processing. Note that in FIGS. 3A and 3B, elements identical to those shown in FIG. 1 are designated by the same reference numerals, and no further description will be given here. A feature of the imprint apparatus 30 of the present embodiment is that a light receiving sensor 31, which is disposed at a position opposite to the concave and convex pattern surface of the mold 5, is provided as a light-emission detecting unit configured to detect light emitted from the residual resin 22.

The light receiving sensor 31 includes a rectilinear CMOS sensor 32, and an array lens 33 that makes the illuminance uniform. As shown in FIG. 3A, the light receiving sensor 31 is moveable in the XY direction, and is disposed on a 2-axis drive unit (driving unit) 34 that changes the relative position with the mold 5. The 2-axis drive unit 34 is constituted by a ball screw, a guide, and a servo motor that are provided at the respective shafts. When the wafer stage 9 is moved to the application position of the ultraviolet curable resin 11 of the dispenser 14, the 2-axis drive unit 34 moves the light receiving sensor 31 to the measurement region of the mold 5. Furthermore, as in the first embodiment, the imprint apparatus 30 includes a control unit 35 configured to control a processing operation regarding the mold 5 depending on the inspection result of the mold 5 based on a light receiving signal acquired by the light receiving sensor 31.

Next, mold inspection processing performed by the imprint apparatus 30 of the present embodiment will be described. In the first embodiment, the imaging element 16 observes light emitted from the residual resin 22. In contrast, in the present embodiment, the light receiving sensor 31 detects light emitted from the residual resin 22. First, the imprint apparatus 30 moves the wafer stage 9 to the application position of the dispenser 14 after imprint processing. Next, the 2-axis drive unit 34 moves the light receiving sensor 31 in the Y-axial direction to the measurement region for the concave and convex portion of the mold 5, and then inspects the entire area of the concave and convex pattern of the mold 5 by scanning it in the X-axial direction. In the present embodiment, the light receiving sensor 31 is employed, and thus, the inspection result for the entire area of the concave and convex pattern 10 of the mold 5 can be output as map based on two-dimensional coordinate data and image output data. In this manner, the position and the size of the residual resin 22 can be grasped accurately.

Alternatively, as shown in FIG. 3B, the light receiving sensor 31 may be disposed at the side of the wafer stage 9 as a variant example of the imprint apparatus 30 shown in FIG. 3A. In this case, in order to apply the ultraviolet curable resin 11 on the second wafer 8, that is, the next treatment object substrate, an imprint apparatus 40 can perform mold inspection simultaneously when the wafer stage 9 is moved to the application position of the dispenser 14. In this manner, the 2-axis drive unit 34 as shown in FIG. 3A becomes unnecessary, whereby the imprint apparatus can be produced at a low cost.

As described above, according to the imprint apparatuses 30 and 40 of the present embodiment, an additional effect can be obtained in addition to the effect obtained by the first embodiment. Since a mold inspection is performed by scanning the light receiving sensor 31, an imaging element having the same area as that of the concave and convex pattern 10 becomes unnecessary. Consequently, a mold inspection can be performed at a relatively low cost.

Third Embodiment

Figure 4:
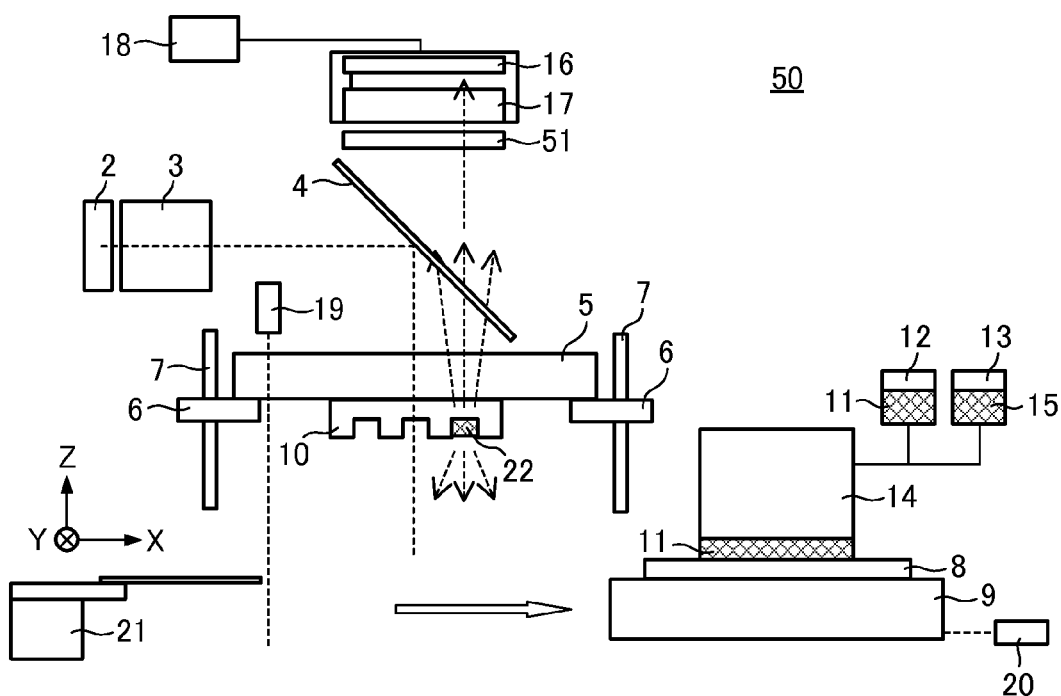
FIG. 4 is a schematic diagram illustrating the configuration of an imprint apparatus according to a third embodiment of the present invention.

Next, an imprint apparatus according to a third embodiment of the present invention will be described. FIG. 4 is a schematic diagram illustrating the configuration of an imprint apparatus according to a third embodiment of the present invention. Since a mold inspection of the present embodiment is carried out after imprint processing, FIG. 4 shows the state of the imprint apparatus after imprint processing. Note that in FIG. 4, elements identical to those shown in FIG. 1 are designated by the same reference numerals, and no further description will be given here. A feature of an imprint apparatus 50 of the present embodiment is that the configuration of the imprint apparatus 1 of the first embodiment further includes a wavelength filter 51. The wavelength filter 51 is an optical filter that is disposed near the imaging surface of the imaging element 16, and only transmits a light-emission wavelength from the residual resin 22 and excludes a light-emission wavelength of another component which may causes disturbances. Although the wavelength filter 51 is not shown in FIG. 4, the wavelength filter 51 may be constituted by a plurality of elements, or may be constituted by a separate switching mechanism.

For example, depending on the configuration of the imprint apparatus, a mold release agent may be applied on the concave and convex portion of the mold 5 in order to enhance the mold releasability of the mold 5. At this time, as a label for detecting the application amount of the mold release agent, another luminescent material (mold release agent-labeling material) may be mixed into the ultraviolet curable resin 11. Hence, by providing the wavelength filter 51, the imprint apparatus 50 can only transmit the wavelength of light emitted from the luminescent material 15 contained in the ultraviolet curable resin 11. Consequently, light emitted from a mold release agent on the concave and convex portion can be distinguished from light emitted from the residual resin 22. In this manner, the imprint apparatus 50 can obtain the inspection result more accurately than the imprint apparatus 1 of the first embodiment.

Likewise, depending on the configuration of the imprint apparatus, a stress luminescent material may be mixed into the ultraviolet curable resin 11 upon releasing the mold 5 so as to detect the mold-release start timing. Thus, a switchable wavelength filter 51 is provided and the luminescent material 15 is selected such that the wavelength of light emitted from the stress luminescent material is different from the wavelength of light emitted from the luminescent material 15. In this manner, by appropriately switching the wavelength filter 51, the imprint apparatus 50 can perform the timing detection upon mold releasing and the inspection of the residual resin 22 using a single imaging element 16.

(Article Manufacturing Method)

A method of manufacturing devices (a semiconductor integrated circuit element, liquid crystal display element, and the like) as an article includes a process for transferring (forming) a pattern on a substrate (a wafer, glass plate, or film-like substrate) using the aforementioned imprint apparatus. Furthermore, the manufacturing method can include a process for etching the substrate on which the pattern is transferred. Note that upon manufacturing other articles such as patterned media (recording media) or optical elements, the manufacturing method can include other process for processing the substrate on which the pattern is transferred in place of etching. The article manufacturing method of this embodiment has an advantage, as compared with a conventional article manufacturing method, in at least one of performance, quality, productivity and production cost of an article.

Other Embodiments

While in the aforementioned embodiments, the respective imprint apparatuses perform mold inspection processing in the state where the mold 5 is held on the mold stage 6 after imprint processing, the present invention is not limited thereto. For example, in the configuration of the first embodiment, the imaging element 16 may be disposed at a separate location within a conveyance path by which the mold 5 is conveyed to the mold stage 6 to thereby perform mold inspection processing. In this manner, for example, when the mold 5 is diverted from another imprint apparatus for usage, whether the mold 5 can be used or not can be determined in advance, resulting in an increase in productivity.

While in the first embodiment, the imaging element 16 is disposed above the ultraviolet light irradiation face of the mold 5, the location at which the imaging element 16 is disposed is not limited thereto, but may be freely disposed depending on the layout of the imprint apparatus.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An imprint method of forming a pattern of a resin on a substrate using a mold, the imprint method comprising:
    a preparing step of preparing a resin composed of a mixture of an ultraviolet curable resin that becomes cured by receiving ultraviolet light and a luminescent material that undergoes fluorescence or phosphorescence upon receiving ultraviolet light;
    an applying step of applying the resin prepared in the preparing step on the substrate;
    an imprinting step of imprinting the mold into the resin after the applying step;
    a curing step of curing the resin imprinted with the mold in the imprinting step using ultraviolet light;
    a releasing step of releasing the mold from the substrate that has been imprinted with the pattern after the curing step; and
    a detecting step of detecting fluorescence or phosphorescence emitted from the cured resin that remains on the mold, based on the received ultraviolet light, after the releasing step.

2. The imprint method according to claim 1, further comprising a determining step of determining whether or not any residual resin is present in the pattern formed on the mold based on the result of the detection.

3. The imprint method according to claim 2, further comprising an outputting step of outputting an error in a case where the determining step determines that any residual resin is present on the mold.

4. The imprint method according to claim 1, wherein:
    the mixture further includes a mold release agent-labeling material or a stress luminescent material having a light-emission wavelength different from that of the luminescent material, and
    the detecting step detects light from the luminescent material using an optical filter.

5. The imprint method according to claim 1, wherein the mixture further includes an another luminescent material having a light-emission wavelength different from that of the luminescent material.

* * * * *